United States Patent
Hsu et al.

(10) Patent No.: US 7,908,744 B2
(45) Date of Patent: Mar. 22, 2011

(54) METHOD FOR FABRICATING PRINTED CIRCUIT BOARD HAVING CAPACITANCE COMPONENTS

(75) Inventors: Shin-Ping Hsu, Hsin-Chu (TW); Chih-Kui Yang, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/541,267

(22) Filed: Aug. 14, 2009

(65) Prior Publication Data
US 2010/0115767 A1    May 13, 2010

(51) Int. Cl.
*H05K 3/36*    (2006.01)

(52) U.S. Cl. ............ 29/830; 29/25.42; 29/840; 29/852; 156/89.12; 438/253

(58) Field of Classification Search .............. 29/825, 29/830, 832, 840, 852; 156/89.12; 438/253
See application file for complete search history.

(56) References Cited

U.S. PATENT DOCUMENTS

| | | | |
|---|---|---|---|
| 4,567,542 A * | 1/1986 | Shimada et al. ............ 361/321.4 |
| 5,456,778 A * | 10/1995 | Fukuta et al. .............. 156/89.17 |
| 6,228,196 B1 * | 5/2001 | Sakamoto et al. .......... 156/89.17 |
| 6,395,118 B1 * | 5/2002 | Sakamoto et al. .......... 156/89.12 |
| 6,488,795 B1 * | 12/2002 | Sakai ........................ 156/89.17 |
| 6,551,427 B2 * | 4/2003 | Sakamoto et al. .......... 156/89.12 |
| 6,967,138 B2 * | 11/2005 | Ding ............................. 438/253 |
| 7,703,198 B2 * | 4/2010 | Jeong et al. .................... 29/832 |
| 2002/0026978 A1 * | 3/2002 | Harada et al. .............. 156/89.11 |
| 2007/0275525 A1 * | 11/2007 | Das et al. ..................... 438/250 |
| 2008/0244902 A1 * | 10/2008 | Blackwell et al. .............. 29/844 |
| 2010/0060381 A1 * | 3/2010 | Das et al. ..................... 333/172 |

\* cited by examiner

*Primary Examiner* — C. J Arbes
(74) *Attorney, Agent, or Firm* — Peter F. Corless; Steven M. Jensen; Edwards Angell Palmer & Dodge LLP (57) ABSTRACT

A method of fabricating a printed circuit board having capacitance components, including: providing a core board having first and second surfaces with first and second wiring layers provided thereon, respectively, and electrically connected, a second dielectric layer, and a carrier board sequentially provided thereon with a second metal layer, a high dielectric material layer, and a third wiring layer with a plurality of first electrode plates thereon; laminating the core board, second dielectric layer, and carrier board to one another; removing the carrier board so as to expose the second metal layer; and patterning the second metal layer so as to form a fifth wiring layer having a plurality of second electrode plates and a plurality of second conductive vias electrically connected to the third wiring layer, thereby allowing the first electrode plates, high dielectric material layer, and second electrode plates together to form a plurality of capacitance components.

13 Claims, 7 Drawing Sheets

METHOD FOR FABRICATING PRINTED CIRCUIT BOARD HAVING CAPACITANCE COMPONENTS

BACKGROUND OF THE INVENTION

1. Field of the Invention

The present invention relates generally to methods for fabricating semiconductor devices, and more particularly, to a method for fabricating a printed circuit board having capacitance components.

2. Description of Related Art

As electronic products have a trend towards high function and high speed, passive components, such as resistors, capacitors or inductors, have to be integrated into semiconductor packages for enhancing or stabilizing the electrical functions of the electronic products.

Figure 1:
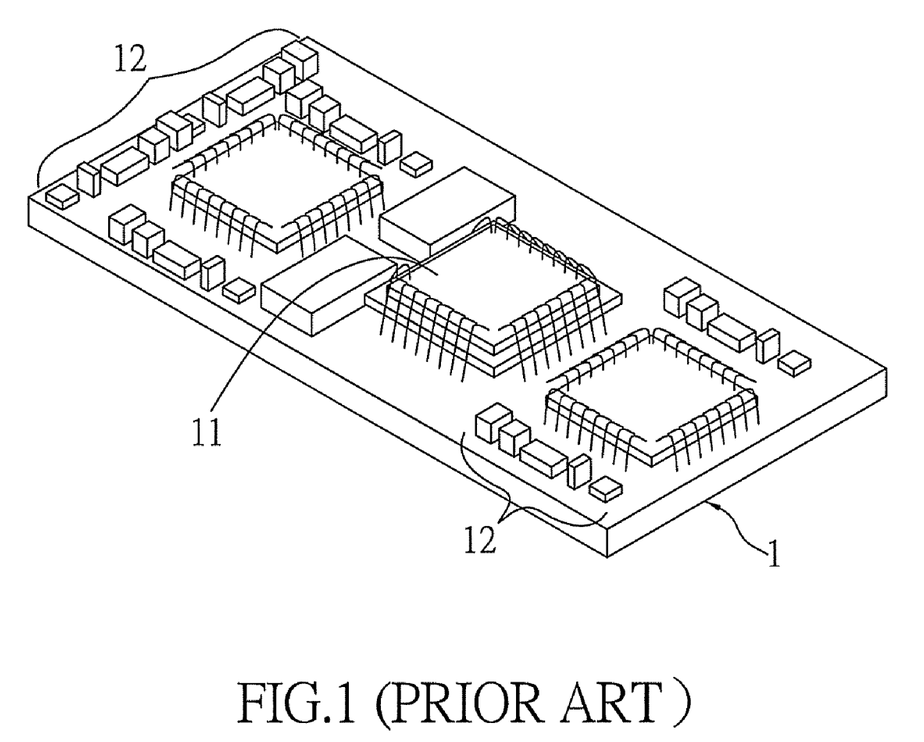
FIG. 1 is a perspective view of a conventional circuit board structure.

As shown in FIG. 1, passive components 12 are generally provided in a region outside semiconductor chip mounting regions so as not to adversely affect electrical connection between active components such as semiconductor chips 11 and a plurality of solder pads (not shown). However, the presence of the passive components 12 decreases the flexibility of circuit layout on the printed circuit board 1, and the positions of the solder pads limit the number of the passive components 12, thereby adversely affecting the integration of semiconductor devices. Moreover, the number of the passive components 12 increases with the requirement of semiconductor devices for high performance. Accordingly, the printed circuit board 1 must accommodate a plurality of semiconductor chips 11 and plenty of passive components 12. As a result, the package size increases and the package cannot meet the development trend of being lighter, thinner, shorter and smaller.

Therefore, printed circuit board structures having embedded active components and passive components are developed for the sake of miniaturization with a view to getting in line with the trend towards lighter, thinner, shorter and smaller electronic products.

FIGS. 2A to 2H are sectional views showing a conventional method for fabricating a printed circuit board having embedded passive components.

Figure 2A:
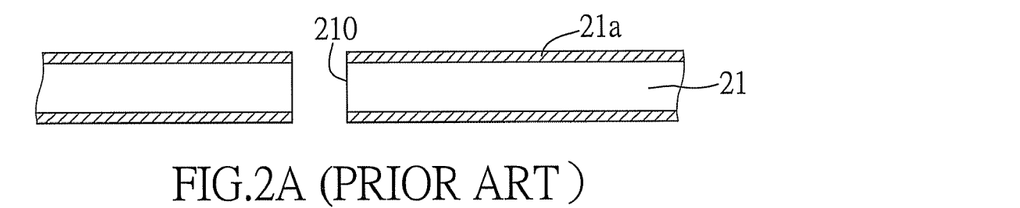
FIGS. 2A to 2H are sectional views showing a conventional method for fabricating a printed circuit board having embedded passive components.

As shown in FIG. 2A, a CCL (Copper Clad Laminate) core board 21 with surfaces thereof covered with a thin metal layer 21a is provided, and at least one through hole 210 is formed to penetrate the core board 21.

Figure 2B:
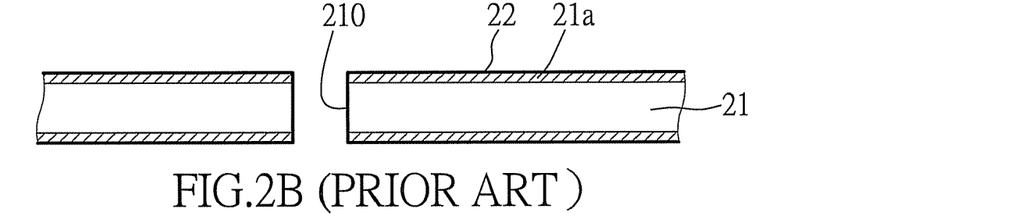

As shown in FIGS. 2A and 2B, a conductive layer 22 is formed on the thin metal layer 21a and on the wall of the through hole 210.

Figure 2C:
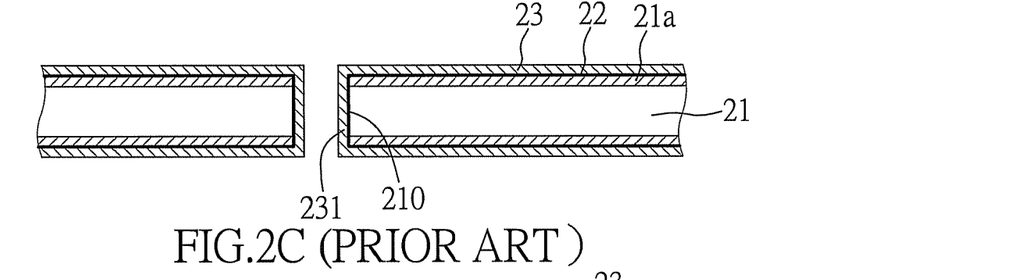

As shown in FIG. 2C, a metal layer 23 is plated to the conductive layer 22 on the thin metal layer 21a and in the through hole 210 such that the through hole 210 becomes a conductive through hole 231.

Figure 2D:
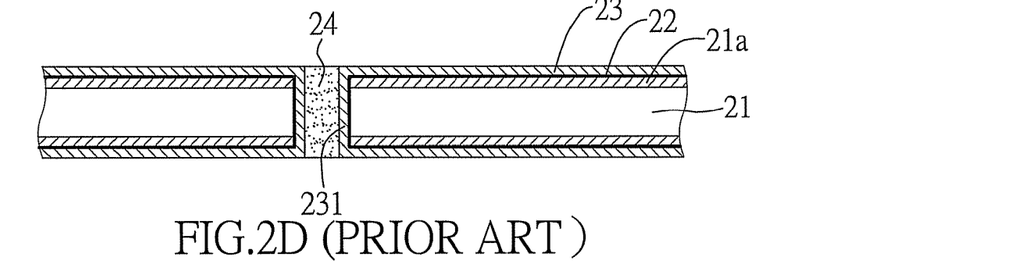

As shown in FIG. 2D, a filling material 24 made of resin fills the conductive through hole 231.

Figure 2E:
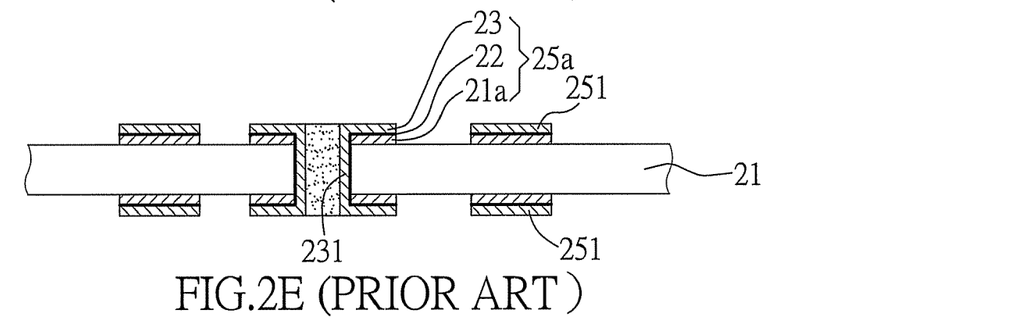

As shown in FIG. 2E, the metal layer 23, the conductive layer 22 and the thin metal layer 21a are patterned so as to form a first wiring layer 25a on the core board 21, wherein the first wiring layer 25a comprises a plurality of first electrode plates 251 and the conductive through hole 231 is electrically connected to the first wiring layer 25a. The patterning process to form the wiring layer 25 is well known in the art and detailed description thereof is omitted herein.

Figure 2F:
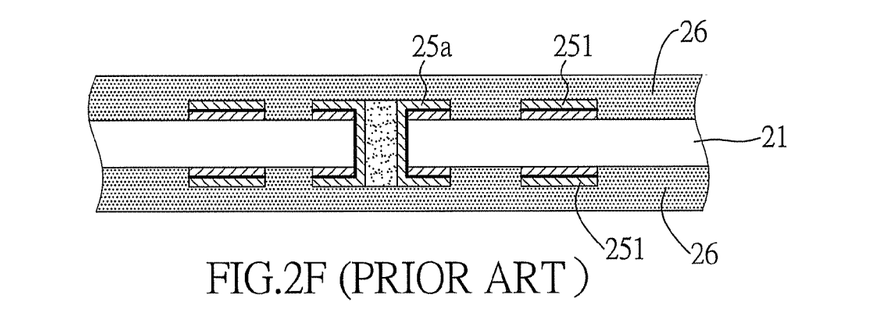

As shown in FIG. 2F, a high dielectric material layer 26 is formed on the core board 21 and the first wiring layer 25a.

Figure 2G:
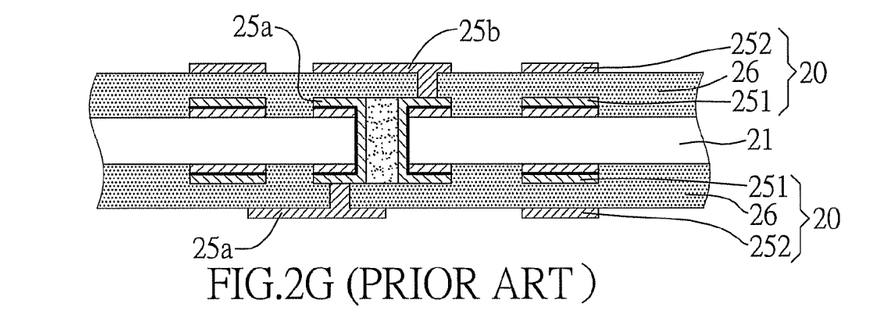

As shown in FIG. 2G, a second wiring layer 25b is formed on the high dielectric material layer 26, wherein the second wiring layer 25b comprises a plurality of second electrode plates 252 corresponding in position to the first electrode plates 251, respectively, such that the first electrode plates 251, the high dielectric material layer 26 and the second electrode plates 252 together form capacitors 20.

Figure 2H:
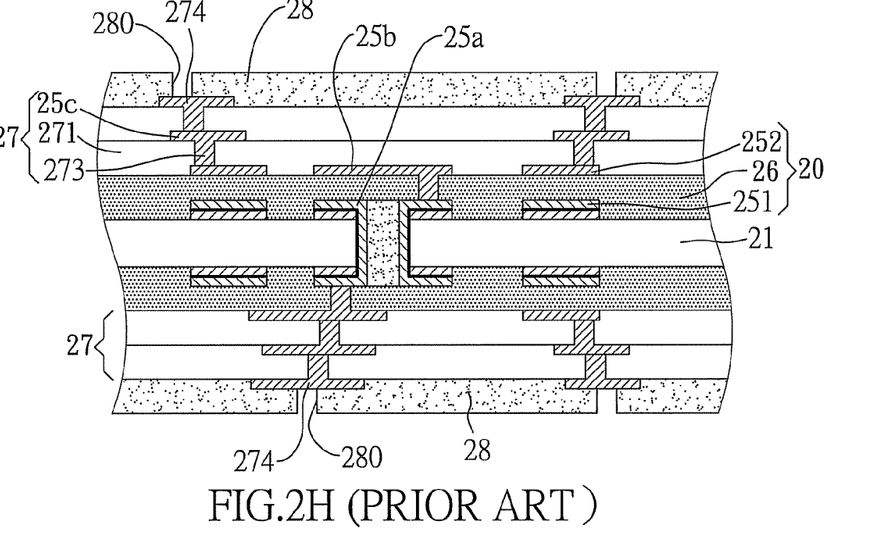

As shown in FIG. 2H, a build-up structure 27 is formed on the second wiring layer 25b and the high dielectric material layer 26, wherein the build-up structure 27 comprises at least a dielectric layer 271, a third wiring layer 25c formed on the dielectric layer 271, and a plurality of conductive vias 273 formed in the dielectric layer 271 and electrically connected to the third wiring layer 25c and the second wiring layer 25b. The build-up structure 27 further comprises a plurality of electrical contact pads 274 electrically connected to the third wiring layer 25c. A solder mask layer 28 is formed on the build-up structure 27. A plurality of openings 280 corresponding in position to the electrical contact pads 274, respectively, are formed in the solder mask layer 28 for exposing the electrical contact pads 274, respectively.

However, in the conventional printed circuit board having embedded capacitance components, since the high dielectric material layer 26 has a high content of ceramic filler, it results in poor flow of the high dielectric material; if the first wiring layer 25a is too thick or the thickness of the high dielectric material layer 26 decreases, space between circuits of the first wiring layer 25a cannot be completely filled with the high dielectric material, thereby resulting in voids or depressions.

Currently, a high Dk thin core layer can also be used as a core board of a printed circuit board structure, but the high Dk dielectric layer of the high Dk thin core layer has a thickness of less than 30 μm and does not contain glass fiber, therefore, after circuits of the printed circuit board structure are finished, the high Dk thin core layer that lacks support from copper foil is easy to crack.

Therefore, it is imperative to provide a method for fabricating a printed circuit board having capacitance components so as to overcome the above-described drawbacks.

SUMMARY OF THE INVENTION

Accordingly, an objective of the present invention is to provide a method for fabricating a printed circuit board having capacitance components so as to avoid formation of voids or depressions which might otherwise occur because space between circuits of a wiring layer is not completely filled by a high dielectric material.

Another objective of the present invention is to provide a method for fabricating a printed circuit board having capacitance components so as to prevent the printed circuit board structure from cracking after completion of a circuit fabrication process by not using a high dielectric material layer as a core board of the printed circuit board structure.

In order to attain the above and other objectives, the present invention provides a method for fabricating a printed circuit board having capacitance components, comprising the steps of: providing a core board, a carrier board, and a second dielectric layer, the core board having a first surface with a first wiring layer thereon and an opposed second surface with a second wiring layer thereon, the first and second wiring layers being electrically connected, the carrier board being sequentially provided thereon with a second metal layer, a high dielectric material layer, and a third wiring layer, the third wiring layer being provided with a plurality of first electrode plates; laminating the core board, the second dielectric layer, and the carrier board to one another so as for the second dielectric layer to be sandwiched between the core board and the carrier board and laminated to the second surface of the core board and the second wiring layer thereon, wherein laminating the high dielectric material layer to the second dielectric layer allows the third wiring layer to be laminated to the second dielectric layer; removing the carrier board so as to expose the second metal layer; and patterning the second metal layer so as to form a fifth wiring layer having a plurality of second electrode plates and a plurality of second conductive vias electrically connected to the third wiring layer, thereby allowing the first electrode plates of the third wiring layer, the high dielectric material layer, and the second electrode plates of the fifth wiring layer together to form a plurality of capacitance components.

In the above-described method, the core board has a plurality of conductive through holes formed therein for electrically connecting the first and second wiring layers.

The method further comprises: providing a first dielectric layer having a first metal layer thereon, and laminating the first dielectric layer to the first surface of the core board and the first wiring layer; forming a first resist layer on the first metal layer, and forming a plurality of first open areas in the first resist layer so as to expose a portion of the first metal layer; removing the first metal layer in the first open areas of the first resist layer so as to form a plurality of first openings in the first metal layer, thereby exposing a portion of the first dielectric layer; removing the first resist layer so as to expose the first metal layer; forming a plurality of third openings in the first dielectric layer exposed from the first openings so as to expose a portion of the first wiring layer; forming a first conductive layer on the first metal layer, on the walls of the first and third openings, and on the first wiring layer in the third openings; forming a third resist layer on the first conductive layer and forming a plurality of third open areas in the third resist layer so as to expose a portion of the first conductive layer; forming a fourth wiring layer on the first conductive layer in the third open areas and forming a plurality of first conductive vias on the first conductive layer in the first and third openings for electrically connecting the first and fourth wiring layers; and removing the third resist layer and the first conductive layer and the first metal layer covered by the third resist layer so as to expose the fourth wiring layer.

The method of forming the fifth wiring layer and the plurality of second conductive vias further comprises: forming a second resist layer on the second metal layer, and forming a plurality of second open areas in the second resist layer so as to expose a portion of the second metal layer; removing the second metal layer in the second open areas so as to form a plurality of second openings in the second metal layer, thereby exposing a portion of the high dielectric material layer; removing the second resist layer so as to expose the second metal layer; forming a plurality of fourth openings in the high dielectric material layer exposed from the second openings so as to expose a portion of the third wiring layer; forming a second conductive layer on the second metal layer, on the walls of the second and fourth openings, and on the third wiring layer in the fourth openings; forming a fourth resist layer on the second conductive layer and forming a plurality of fourth open areas in the fourth resist layer so as to expose a portion of the second conductive layer; forming the fifth wiring layer on the second conductive layer in the fourth open areas and forming the plurality of the second conductive vias on the second conductive layer in the second and fourth openings for electrically connecting the third and fifth wiring layers, wherein the second electrode plates of the fifth wiring layer correspond in position to the first electrode plates of the third wiring layer; and removing the fourth resist layer and the second conductive layer and the second metal layer covered by the fourth resist layer so as to expose the fifth wiring layer.

The method further comprises forming a plurality of fifth openings in the second dielectric layer in a portion of the fourth openings for exposing a portion of the second wiring layer, forming the second conductive layer in the fourth openings and the fifth openings, and forming a plurality of third conductive vias on the second conductive layer in the fourth and fifth openings for electrically connecting the second and fifth wiring layers.

The method further comprises forming a first build-up structure on the first dielectric layer and the fourth wiring layer, wherein the first build-up structure comprises at least a third dielectric layer, a sixth wiring layer formed on the third dielectric layer, and a plurality of fourth conductive vias formed in the third dielectric layer and electrically connected to the fourth and sixth wiring layers. The sixth wiring layer comprises a plurality of electrical contact pads. A first solder mask layer is formed on the third dielectric layer and the sixth wiring layer. A plurality of first solder mask openings corresponding in position to the electrical contact pads, respectively, are formed in the first solder mask layer so as to expose the electrical contact pads.

The method further comprises forming a second build-up structure on the high dielectric material layer and the fifth wiring layer, wherein the second build-up structure comprises at least a third dielectric layer, a sixth wiring layer formed on the third dielectric layer, and a plurality of fourth conductive vias formed in the third dielectric layer and electrically connected to the fifth and sixth wiring layers, the sixth wiring layer comprises a plurality of electrical contact pads, a second solder mask layer is formed on the sixth wiring layer, and a plurality of second solder mask openings corresponding in position to the electrical contact pads, respectively, are formed in the second solder mask layer so as to expose the electrical contact pads.

According to another embodiment, a first solder mask layer is formed on the first dielectric layer and the fourth wiring layer, and a plurality of first solder mask openings are formed in first solder mask layer such that a portion of the fourth wiring layer is exposed to thereby serve as electrical contact pads. Further, a second solder mask layer is formed on the high dielectric material layer and the fifth wiring layer, and a plurality of second solder mask openings are formed in the second solder mask layer such that a portion of the fifth wiring layer is exposed to thereby serve as electrical contact pads.

Therefore, the present invention mainly comprises forming the third wiring layer with the plurality of first electrode plates on one surface of the high dielectric material layer, laminating the second dielectric layer and the high dielectric material layer with the third wiring layer to the second surface of the core board and the second wiring layer, and patterning the second metal layer on the other surface of the high dielectric material layer so as to form the fifth wiring layer with the plurality of second electrode plates, wherein the second electrode plates correspond in position to the first electrode plates such that the first electrode plates, the high dielectric material layer, and the second electrode plates together form a plurality of capacitance components. Since the process of laminating and filling of the high dielectric material between the circuits is eliminated, no gap is formed between the circuits or between the circuits and the high dielectric material layer, thereby avoiding formation of voids or depressions. Meanwhile, the high dielectric material layer is laminated to the second surface of the core board through the second dielectric layer and the core board is used as a support so as to avoid the use of the high dielectric material layer as a core layer, thereby overcoming the conventional drawback of cracking of the printed circuit board structure.

BRIEF DESCRIPTION OF DRAWINGS

FIG. 3J' is another embodiment of the method depicted in FIG. 3J.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

FIGS. 3A to 3J are sectional diagrams showing a method for fabricating a printed circuit board having capacitance components according to the present invention.

Figure 3A:
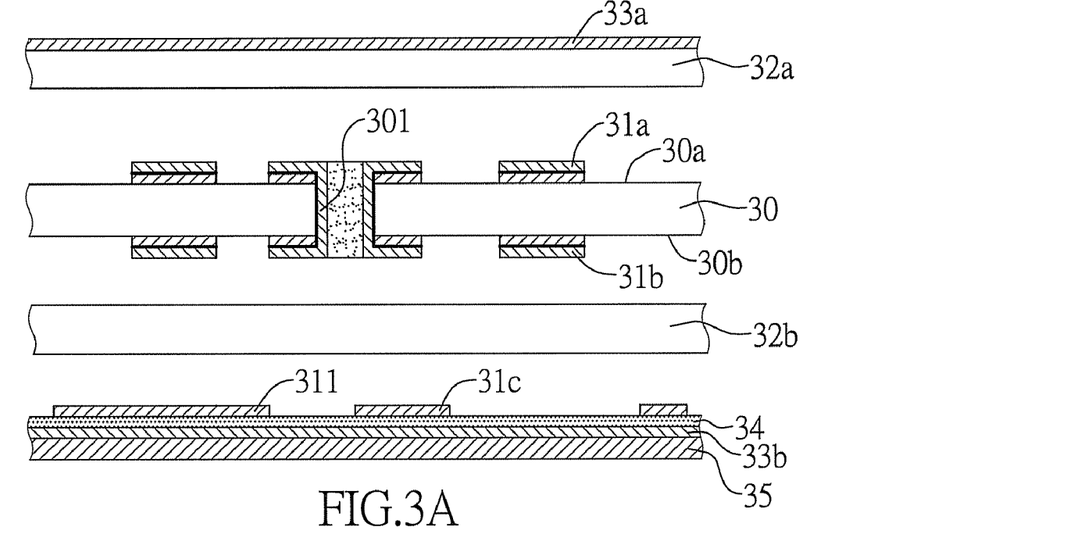
FIGS. 3A to 3J are sectional views showing a method for fabricating a printed circuit board having capacitance components according to the present invention.
Figure 3B:
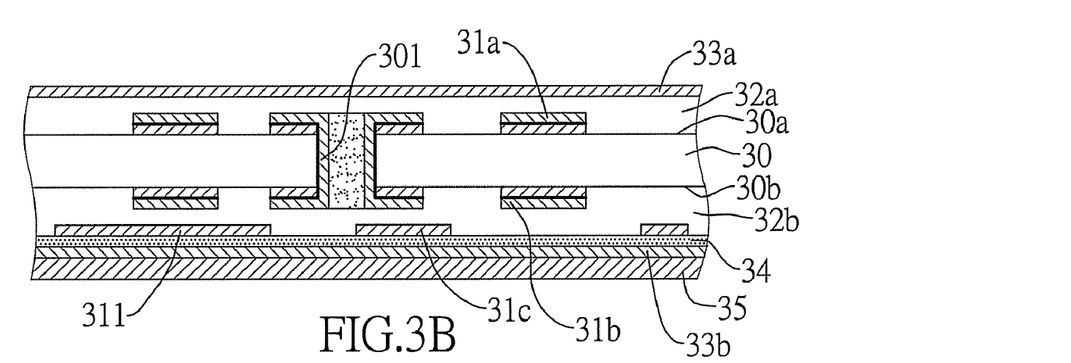

As shown in FIGS. 3A and 3B, a core board 30, a carrier board 35, a first dielectric layer 32a having a first metal layer 33a such as a RCC (resin coated copper), and a second dielectric layer 32b are provided. The core board 30 has a first surface 30a and a second surface 30b opposed to the first surface 30a. The first surface 30a has a first wiring layer 31a, and the second surface 30b has a second wiring layer 31b. The core board 30 has a plurality of conductive through holes 301 for electrically connecting the first wiring layer 31a and the second wiring layer 31b. A second metal layer 33b, a high dielectric material layer 34 and a third wiring layer 31c are sequentially formed on the carrier board 35. The third wiring layer 31c has a plurality of first electrode plates 311. The core board 30, the first dielectric layer 32a, the second dielectric layer 32b, and the carrier board 35 are laminated to one another. The first dielectric layer 32a is laminated to the first surface 30a of the core board 30 and the first wiring layer 31a. The second dielectric layer 32b is positioned between the core board 30 and the carrier board 35. The second dielectric layer 32b is formed on the second surface 30b of the core board 30 and the second wiring layer 31b. The high dielectric material layer 34 is laminated to the second dielectric layer 32b and the third wiring layer 31c thereon is embedded in the second dielectric layer 32b to enable the surface of the third wiring layer 31c to be flush with the surface of the second dielectric layer 32b.

Figure 3C:
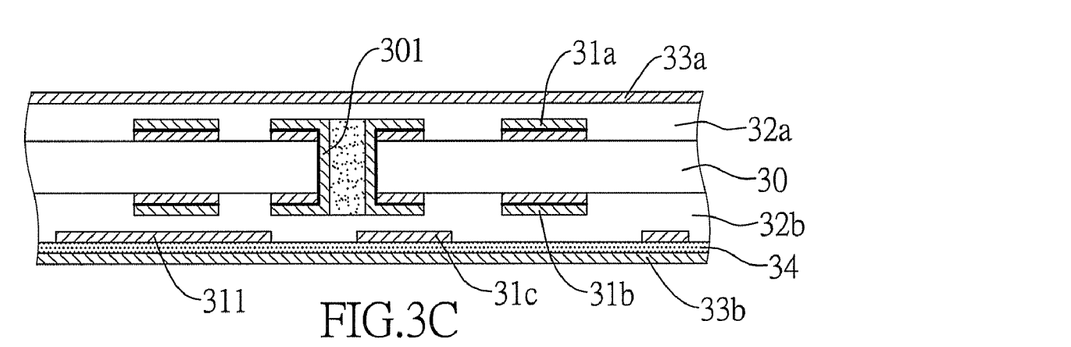

As shown in FIG. 3C, the carrier board 35 is removed so as to expose the second metal layer 33b.

Figure 3D:
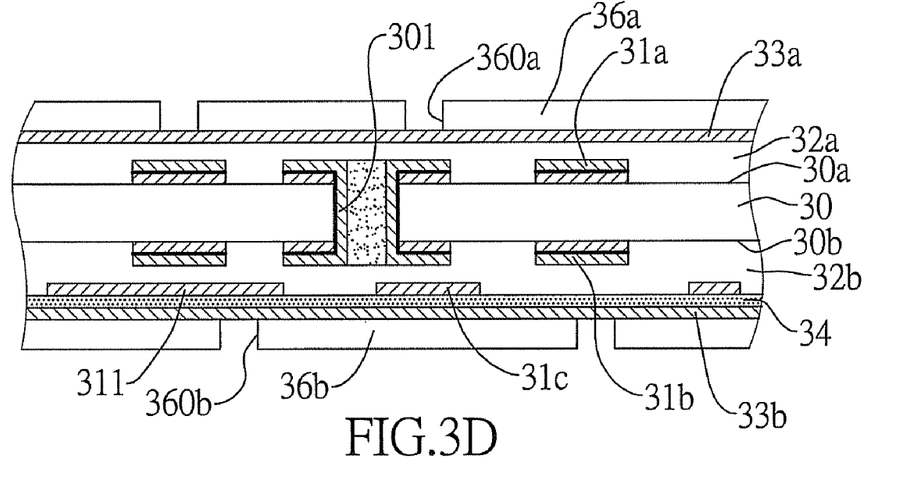

As shown in FIG. 3D, a first resist layer 36a is formed on the first metal layer 33a, and a plurality of first open areas 360a are formed in the first resist layer 36a so as to expose a portion of the first metal layer 33a; and a second resist layer 36b is formed on the second metal layer 33b and a plurality of second open areas 360b are formed in the second resist layer 36b so as to expose a portion of the second metal layer 33b. The first and second resist layers 36a, 36b can be made of a dry film photoresist layer or a liquid photoresist layer.

Figure 3E:
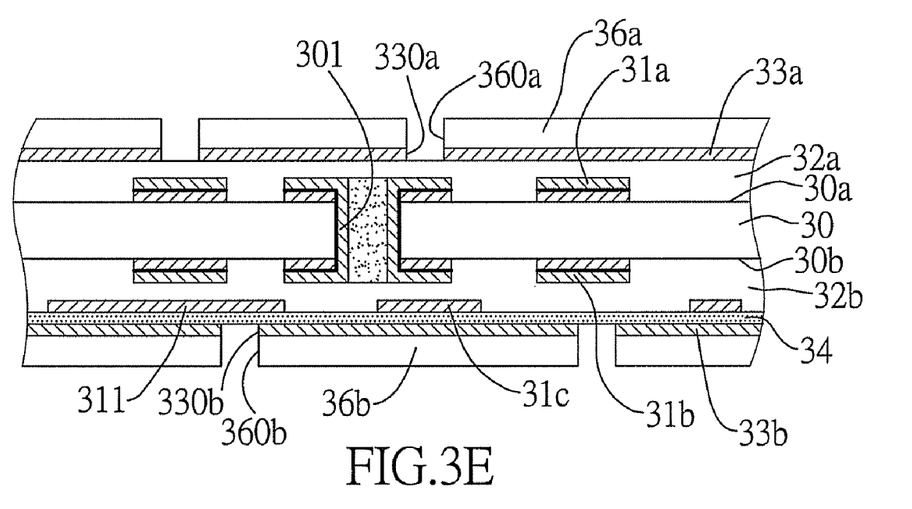

As shown in FIG. 3E, the first metal layer 33a in the first open areas 360a is removed by etching so as to form a plurality of first openings 330a in the first metal layer 33a for exposing a portion of the first dielectric layer 32a; and the second metal layer 33b in the second open areas 360b is removed by etching so as to form a plurality of second openings 330b in the second metal layer 33b for exposing a portion of the high dielectric material layer 34.

Figure 3F:
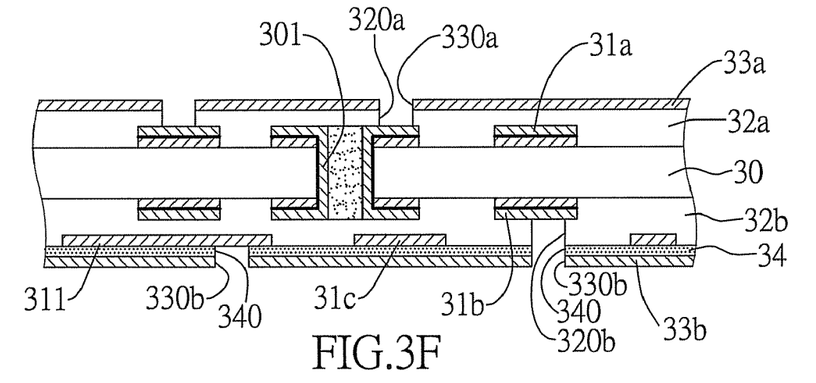

As shown in FIG. 3F, the first and second resist layers 36a, 36b are removed to expose the first and second metal layers 33a, 33b, respectively. Subsequently, a plurality of third openings 320a are formed by laser drilling in the first dielectric layer 32a in the first openings 330a of the first metal layer 33a so as to expose a portion of the first wiring layer 31a; and a plurality of fourth openings 340 are formed by laser drilling in the high dielectric material layer 34 in the second openings 330b so as to expose a portion of the third wiring layer 31c, wherein a plurality of fifth openings 320b are formed in the second dielectric layer 32b in a portion of the fourth openings 340 for exposing a portion of the second wiring layer 31b.

Figure 3G:
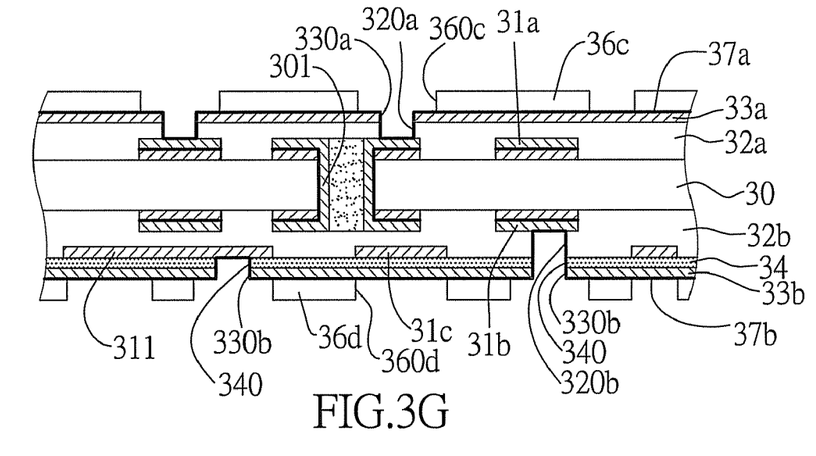

As shown in FIG. 3G, a first conductive layer 37a is formed on the first metal layer 33a, on the walls of the first and third openings 330a, 320a, and on the first wiring layer 31a in the third openings 320a. Further, a third resist layer 36c is formed on the first conductive layer 37a, and a plurality of third open areas 360c are formed in the third resist layer 36c to expose a portion of the first conductive layer 37a. In addition, a second conductive layer 37b is formed on the second metal layer 33b, on the walls of the second openings 330b and the fourth openings 340, and on the third wiring layer 31c in the fourth openings 340, on the walls of the second, fourth and fifth openings 330b, 340, 320b, and on the second wiring layer 31b in the fifth openings 320b. Subsequently, a fourth resist layer 36d is formed on the second conductive layer 37b, and a plurality of fourth open areas 360d are formed in the fourth resist layer 36d to expose a portion of the second conductive layer 37b. The above-described first conductive layer 37a and the second conductive layer 37b mainly function as current conductive paths for a subsequent electroplating process, which can be made of metal or several deposited metal layers such as a single or multi-layer structure of copper (Cu), tin (Sn), nickel (Ni), chromium (Cr), titanium (Ti), copper-chromium (Cu—Cr) or made of a conductive polymer such as polyacetylene, polyaniline or an organic sulfur polymer. Each of the third and fourth resist layers 36c, 36d is a dry film photoresist layer or a liquid photoresist layer.

Figure 3H:
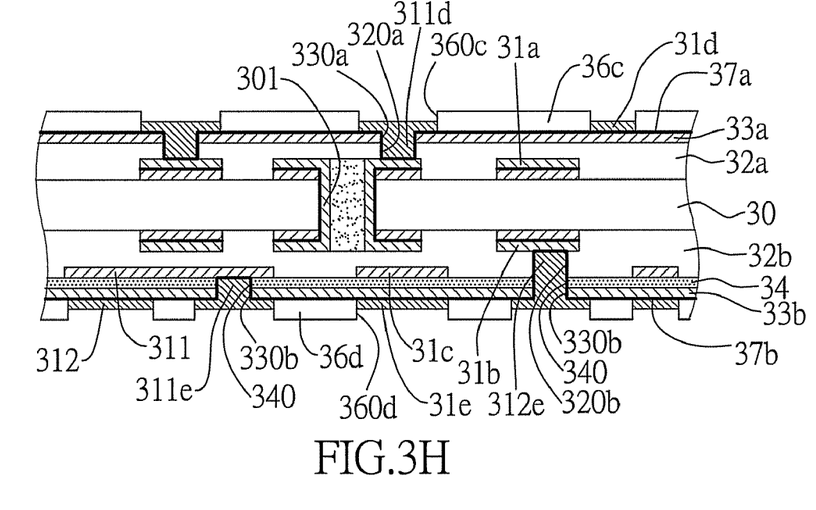
Figure 3I:
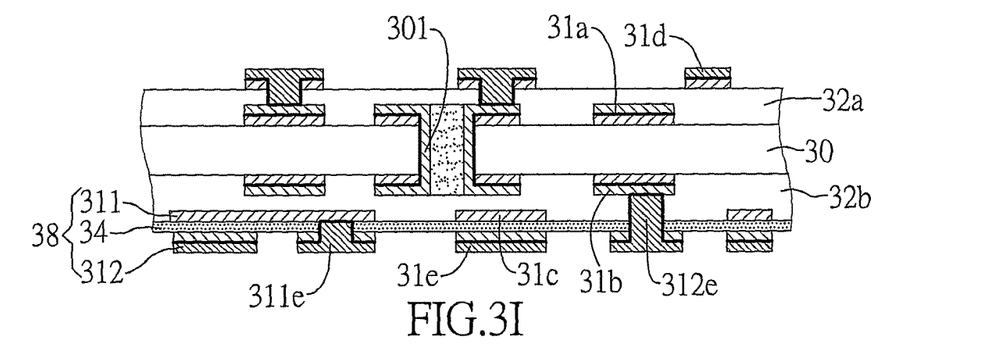

Refer to FIG. 3H for the following descriptions. A fourth wiring layer 31d is formed on the first conductive layer 37a in the third open areas 360c. A plurality of first conductive vias 311d are formed on the first conductive layer 37a in the first and third openings 330a, 320a for electrically connecting the first and fourth wiring layers 31a, 31d. A fifth wiring layer 31e with a plurality of second electrode plates 312 is formed on the second conductive layer 37b in the fourth open areas 360d. A plurality of second conductive vias 311e are formed on the second conductive layer 37b in the second and fourth openings 330b, 340 for electrically connecting the third and fifth wiring layers 31c, 31e. A plurality of third conductive vias 312e are formed on the second conductive layer 37b in the second, fourth and fifth openings 330b, 340, 320b for electrically connecting the second and fifth wiring layers 31b, 31e, wherein the second electrode plates 312 correspond in position to the first electrode plates 311.

Figure 3J:
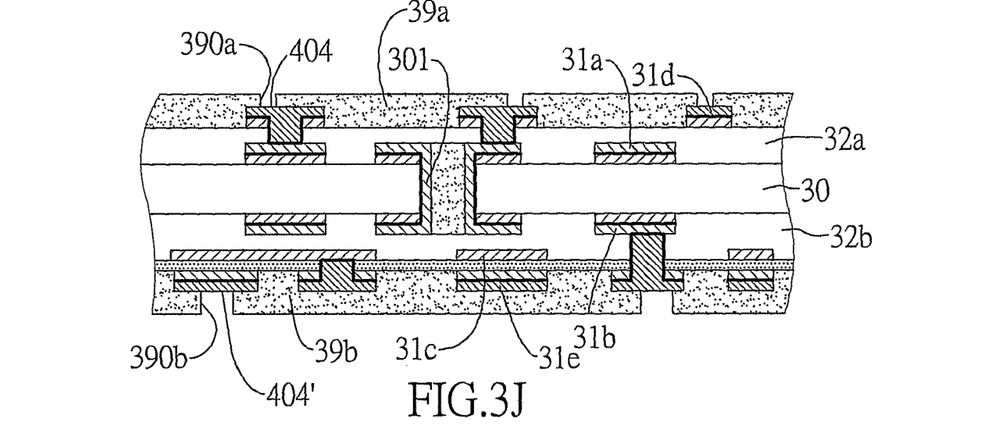

As shown in FIG. 3J, the third resist layer 36c and the first conductive layer 37a and the first metal layer 33a covered by the third resist layer 36c are removed so as to expose the fourth wiring layer 31d. Also, the fourth resist layer 36d and the second conductive layer 37b and the second metal layer 33b covered by the fourth resist layer 36d are removed so as to expose the fifth wiring layer 31e. Thus, the first electrode plates 311, the high dielectric material layer 34 and the second electrode plates 312 together form a plurality of capacitance components 38.

As shown in FIG. 3J, a first solder mask layer 39a is formed on the first dielectric layer 32a and the fourth wiring layer 31d, and a plurality of first solder mask openings 390a are formed in the first solder mask layer 39a such that a portion of the fourth wiring layer 31d is exposed to thereby serve as electrical contact pads 404. Further, a second solder mask layer 39b is formed on the high dielectric material layer 34 and the fifth wiring layer 31e, and a plurality of second solder mask openings 390b are formed in the second solder mask layer 39b such that a portion of the fifth wiring layer 31e is exposed to thereby serve as electrical contact pads 404'. Alternatively, as shown in FIG. 3J', a first build-up structure 40 is formed on the first dielectric layer 32a and the fourth wiring layer 31d, and a second build-up structure 40' is formed on the high dielectric material layer 34 and the fifth wiring layer 31e. Therein, the first build-up structure 40 comprises at least a third dielectric layer 401, a sixth wiring layer 402 formed on the third dielectric layer 401, and a plurality of fourth conductive vias 403 formed in the third dielectric layer 401 and electrically connected to the fourth and sixth wiring layers 31d, 402. A plurality of electrical contact pads 404 are formed to be electrically connected to the sixth wiring layer 402 of the first build-up structure 40. A first solder mask layer 39a is formed on the first build-up structure 40. A plurality of first solder mask openings 390a corresponding in position to the electrical contact pads 404, respectively, are formed in the first solder mask layer 39a for exposing the electrical contact pads 404. The second build-up structure 40' comprises at least a third dielectric layer 401', a sixth wiring layer 402' formed on the third dielectric layer 401', and a plurality of fourth conductive vias 403' formed in the third dielectric layer 401' and electrically connected to the fifth and sixth wiring layers 31e, 402'. A plurality of electrical contact pads 404' are formed to be electrically connected to the sixth wiring layer 402' of the second build-up structure 40'. A second solder mask layer 39b is formed on the second build-up structure 40'. A plurality of second solder mask openings 390b corresponding in position to the electrical contact pads 404', respectively, are formed in the second solder mask layer 39b so as to expose the electrical contact pads 404'.

In order to achieve the above and other objectives, the present invention further provides a printed circuit board having capacitance components, which comprises: a core board 30 having a first surface 30a and a second surface 30b opposed to the first surface 30a, wherein the first surface 30a has a first wiring layer 31a formed thereon, the second surface 30b has a second wiring layer 31b formed thereon, and the first wiring layer 31a is electrically connected to the second wiring layer 31b; a second dielectric layer 32b covering the second surface 30b of the core board 30 and the second wiring layer 31b; a third wiring layer 31c formed in the second dielectric layer 32b, wherein the surface of the third wiring layer 31c is exposed from the second dielectric layer 32b and flush with the surface of the second dielectric layer 32b, the third wiring layer 31c comprising a plurality of first electrode plates 311; a high dielectric material layer 34 covering the second dielectric layer 32b and the third wiring layer 31c; a fifth wiring layer 31e formed on the high dielectric material layer 34, wherein a plurality of second conductive vias 311e are formed in the high dielectric material layer 34 so as to electrically connect the third and fifth wiring layers 31c, 31e, and a plurality of third conductive vias 312e are formed in the high dielectric material layer 34 and the second dielectric layer 32b so as to electrically connect the second and fifth wiring layers 31b, 31e, and the fifth wiring layer 31e comprises a plurality of second electrode plates 312 such that the first electrode plates 311 of the third wiring layer 31c, the high dielectric material layer 34, and the second electrode plates 312 of the fifth wiring layer 31e together form a plurality of capacitance components.

In the above-described printed circuit board having capacitance components, the core board 30 has a plurality of conductive through holes 301 for electrically connecting the first wiring layer 31a and the second wiring layer 31b.

The above structure further comprises a first dielectric layer 32a covering the first surface 30a of the core board 30 and the first wiring layer 31a; and a fourth wiring layer 31d formed on the first dielectric layer 32a, wherein a plurality of first conductive vias 311d are formed in the first dielectric layer 32a for electrically connecting the first and fourth wiring layers 31a, 31d.

The above structure further comprises a first build-up structure 40 formed on the first dielectric layer 32a and the fourth wiring layer 31d. Therein, the first build-up structure 40 comprises at least a third dielectric layer 401, a sixth wiring layer 402 formed on the third dielectric layer 401, and a plurality of fourth conductive vias 403 formed in the third dielectric layer 401 and electrically connected to the fourth wiring layer 31d and the sixth wiring layer 402. The sixth wiring layer 402 comprises a plurality of electrical contact pads 404. A first solder mask layer 39a is formed on the third dielectric layer 401 and the sixth wiring layer 402. A plurality of first solder mask openings 390a corresponding in position to the electrical contact pads 404, respectively, are formed in the first solder mask layer 39a so as to expose the electrical contact pads 404. Further, a second build-up structure 40' is formed on the high dielectric material layer 34 and the fifth wiring layer 31e. Therein, the second build-up structure 40' comprises at least a third dielectric layer 401', a sixth wiring layer 402' formed on the third dielectric layer 401', and a plurality of fourth conductive vias 403' formed in the third dielectric layer 401' and electrically connected to the fifth wiring layer 31e and the sixth wiring layer 402'. The sixth wiring layer 402' comprises a plurality of electrical contact pads 404'. A second solder mask layer 39b is formed on the third dielectric layer 401' and the sixth wiring layer 402'. A plurality of second solder mask openings 390b corresponding in position to the electrical contact pads 404', respectively, are formed in the second solder mask layer 39b so as to expose the electrical contact pads 404'.

According to another embodiment, the printed circuit board having capacitance components further comprises: a first solder mask layer 39a formed on the first dielectric layer 32a and the fourth wiring layer 31d, wherein a plurality of first solder mask openings 390a are formed in the first solder mask layer 39a such that a portion of the fourth wiring layer 31d is exposed to thereby serve as electrical contact pads 404; and a second solder mask layer 39b formed on the high dielectric material layer 34 and the fifth wiring layer 31e, wherein a plurality of second solder mask openings 390b are formed in the second solder mask layer 39b such that a portion of the fifth wiring layer 31e is exposed to thereby serve as electrical contact pads 404.

Therefore, the present invention mainly comprises forming the third wiring layer with the plurality of first electrode plates on one surface of the high dielectric material layer, laminating the second dielectric layer and the high dielectric material layer with the third wiring layer to the second surface of the core board and the second wiring layer, and patterning the second metal layer on the other surface of the high dielectric material layer so as to form the fifth wiring layer with the plurality of second electrode plates, wherein the second electrode plates correspond in position to the first electrode plates such that the first electrode plates, the high dielectric material layer, and the second electrode plates together form a plurality of capacitance components. Since the process of laminating and filling of the high dielectric material between the circuits is eliminated, no gap is formed between the circuits or between the circuits and the high dielectric material layer, thereby avoiding formation of voids or depressions. Meanwhile, the high dielectric material layer is laminated to the second surface of the core board through the second dielectric layer and the core board is used as a support so as to avoid the use of the high dielectric material layer as a core layer, thereby overcoming the conventional drawback of cracking of the printed circuit board structure.

The above-described descriptions of the detailed embodiments are only to illustrate the preferred implementation according to the present invention, and it is not to limit the scope of the present invention. All modifications and variations completed by those with ordinary skill in the art should fall within the scope of present invention defined by the appended claims.

What is claimed is:

1. A method for fabricating a printed circuit board having capacitance components, comprising the steps of:
    providing a core board, a carrier board, and a second dielectric layer, the core board having a first surface with a first wiring layer thereon and an opposed second surface with a second wiring layer thereon, the first and second wiring layers being electrically connected, the carrier board being sequentially provided thereon with a second metal layer, a high dielectric material layer, and a third wiring layer, the third wiring layer being provided with a plurality of first electrode plates;
    laminating the core board, the second dielectric layer, and the carrier board to one another so as for the second dielectric layer to be sandwiched between the core board and the carrier board and laminated to the second surface of the core board and the second wiring layer thereon, wherein laminating the high dielectric material layer to the second dielectric layer allows the third wiring layer to be laminated to the second dielectric layer;
    removing the carrier board so as to expose the second metal layer; and
    patterning the second metal layer so as to form a fifth wiring layer having a plurality of second electrode plates and a plurality of second conductive vias electrically connected to the third wiring layer, thereby allowing the first electrode plates of the third wiring layer, the high dielectric material layer, and the second electrode plates of the fifth wiring layer together to form a plurality of capacitance components.

2. The method of claim 1, wherein the core board has a plurality of conductive through holes formed therein for electrically connecting the first and second wiring layers.

3. The method of claim 1, further comprising the steps of:
    providing a first dielectric layer having a first metal layer thereon, and laminating the first dielectric layer to the first surface of the core board and the first wiring layer thereon while laminating the core board, the second dielectric layer, and the carrier board to one another;
    forming a first resist layer on the first metal layer, and forming a plurality of first open areas in the first resist layer so as to expose a portion of the first metal layer;
    removing the first metal layer in the first open areas of the first resist layer so as to form a plurality of first openings in the first metal layer, thereby exposing a portion of the first dielectric layer;
    removing the first resist layer so as to expose the first metal layer;
    forming a plurality of third openings in the first dielectric layer exposed from the first openings so as to expose a portion of the first wiring layer;
    forming a first conductive layer on the first metal layer, on the walls of the first and third openings, and on the first wiring layer in the third openings;
    forming a third resist layer on the first conductive layer and forming a plurality of third open areas in the third resist layer so as to expose a portion of the first conductive layer;
    forming a fourth wiring layer on the first conductive layer in the third open areas and forming a plurality of first conductive vias on the first conductive layer in the first and third openings for electrically connecting the first and fourth wiring layers; and
    removing the third resist layer and the first conductive layer and the first metal layer covered by the third resist layer so as to expose the fourth wiring layer.

4. The method of claim 1, wherein the forming the fifth wiring layer having a plurality of second electrode plates and a plurality of second conductive vias comprises the steps of:
    forming a second resist layer on the second metal layer, and forming a plurality of second open areas in the second resist layer so as to expose a portion of the second metal layer;
    removing the second metal layer in the second open areas so as to form a plurality of second openings in the second metal layer, thereby exposing a portion of the high dielectric material layer;
    removing the second resist layer so as to expose the second metal layer;
    forming a plurality of fourth openings in the high dielectric material layer exposed from the second openings so as to expose a portion of the third wiring layer;
    forming a second conductive layer on the second metal layer, on the walls of the second and fourth openings, and on the third wiring layer in the fourth openings;
    forming a fourth resist layer on the second conductive layer and forming a plurality of fourth open areas in the fourth resist layer so as to expose a portion of the second conductive layer;
    forming the fifth wiring layer on the second conductive layer in the fourth open areas and forming the plurality of second conductive vias on the second conductive layer in the second and fourth openings for electrically connecting the third and fifth wiring layers, wherein the second electrode plates of the fifth wiring layer correspond in position to the first electrode plates of the third wiring layer; and
    removing the fourth resist layer and the second conductive layer and the second metal layer covered by the fourth resist layer so as to expose the fifth wiring layer.

5. The method of claim 4, further comprising the steps of: forming a plurality of fifth openings in the second dielectric layer exposed from a portion of the fourth openings for exposing a portion of the second wiring layer, forming the second conductive layer in the fourth openings and the fifth openings, and forming a plurality of third conductive vias on the second conductive layer exposed from the fourth and fifth openings for electrically connecting the second and fifth wiring layers.

6. The method of claim 1, further comprising the step of forming a first build-up structure on the first dielectric layer and the fourth wiring layer.

7. The method of claim 6, wherein the first build-up structure comprises at least a third dielectric layer, a sixth wiring layer formed on the third dielectric layer, and a plurality of fourth conductive vias formed in the third dielectric layer and electrically connected to the fourth and sixth wiring layers, the sixth wiring layer comprising a plurality of electrical contact pads, allowing a first solder mask layer to be formed on the third dielectric layer and the sixth wiring layer, and allowing a plurality of first solder mask openings corresponding in position to the electrical contact pads, respectively, to be formed in the first solder mask layer so as to expose the electrical contact pads.

8. The method of claim 1, further comprising the step of forming a second build-up structure on the high dielectric material layer and the fifth wiring layer.

9. The method of claim 8, wherein the second build-up structure comprises at least a third dielectric layer, a sixth wiring layer formed on the third dielectric layer, and a plurality of fourth conductive vias formed in the third dielectric layer and electrically connected to the fifth and sixth wiring layers, the sixth wiring layer comprising a plurality of electrical contact pads and being provided with a second solder mask layer formed thereon, allowing a plurality of second solder mask openings corresponding in position to the electrical contact pads, respectively, to be formed in the second solder mask layer so as to expose the electrical contact pads.

10. The method of claim 1, further comprising the step of forming a first solder mask layer on the first dielectric layer and the fourth wiring layer.

11. The method of claim 10, wherein a plurality of first solder mask openings are formed in first solder mask layer so as for a portion of the fourth wiring layer to be exposed to thereby serve as electrical contact pads.

12. The method of claim 1, further comprising the step of forming a second solder mask layer on the high dielectric material layer and the fifth wiring layer.

13. The method of claim 12, wherein a plurality of second solder mask openings are formed in the second solder mask layer so as for a portion of the fifth wiring layer to be exposed to thereby serve as electrical contact pads.

* * * * *